United States Patent [19]

Shekhawat et al.

[11] Patent Number: 4,885,486

[45] Date of Patent: Dec. 5, 1989

[54] DARLINGTON AMPLIFIER WITH HIGH SPEED TURNOFF

[75] Inventors: Sampat S. Shekhawat; John J. Dhyanchand, both of Rockford; John Horowy, Roscoe, all of Ill.

[73] Assignee: Sundstrand Corp., Rockford, Ill.

[21] Appl. No.: 135,226

[22] Filed: Dec. 21, 1987

[51] Int. Cl.$^4$ ............... H03K 17/04; H03K 17/56
[52] U.S. Cl. ................... 307/570; 307/263; 307/300; 307/315
[58] Field of Search ............ 307/300, 570, 263, 315

[56] References Cited

U.S. PATENT DOCUMENTS

| 4,028,561 | 6/1977 | Black et al. | 307/300 |
|---|---|---|---|
| 4,303,841 | 12/1981 | Baker | 307/570 |
| 4,356,416 | 10/1982 | Weischedel | 307/570 |
| 4,423,341 | 12/1983 | Shelly | 307/570 |
| 4,480,201 | 10/1984 | Jaeschke | 307/362 |
| 4,481,434 | 11/1984 | Janutka | 307/570 |
| 4,492,883 | 1/1985 | Janutka | 307/571 |
| 4,500,801 | 2/1985 | Janutka | 307/570 |
| 4,547,686 | 10/1985 | Chen | 307/570 |
| 4,590,395 | 5/1985 | O'Connor et al. | 307/570 |
| 4,604,535 | 8/1986 | Sasayama et al. | 307/570 |
| 4,725,741 | 2/1988 | Shekhawat et al. | 307/315 |

FOREIGN PATENT DOCUMENTS

| 0086921 | 5/1984 | Japan | 307/570 |
|---|---|---|---|
| 0164327 | 7/1986 | Japan | 307/570 |

*Primary Examiner*—John Zazworsky
*Attorney, Agent, or Firm*—Antonelli, Terry & Wands

[57] ABSTRACT

A Darlington-type amplifier (10) having an input field effect transistor and an output bipolar transistor ($T_2$) is disclosed with improved turn-off time. Turnoff is enhanced by short-circuiting the gate-to-source or drain capacitance of the input field effect transistor ($T_1$) and after turnoff is complete of the input field effect transistor prior to turn off of the output bipolar transistor ($T_2$) coupling the base of the output bipolar transistor to a reference potential to discharge minority carriers therein to complete turnoff.

14 Claims, 2 Drawing Sheets

DARLINGTON AMPLIFIER WITH HIGH SPEED TURNOFF

TECHNICAL FIELD

The present invention relates to turn-off circuits for Darlington-type amplifiers having an input MOSFET transistor and a bipolar output transistor.

BACKGROUND ART

Hybrid Darlington amplifiers are known in which a field effect transistor functions as an input amplifying stage and a bipolar transistor functions as a second amplification stage for providing a low output impedance with a high degree of amplification of an input signal applied to the input amplification stage. See U.S. Pat. Nos. 4,303,841, 4,480,201, 4,547,686, 4,590,395 and U.S. Pat. No. 4,604,535.

U.S. Pat. No. 4,547,686 discloses an amplifier which uses a Zener diode to discharge the capacitance of field effect transistor $Q_2$ during turnoff. See column 2, lines 18-26 and column 3, lines 34-45.

U.S. Pat. No. 4,590,395 discloses as "prior art" in FIG. 3 a shunt field effect transistor 72 which removes minority carriers in a bipolar transistor 76 to promote turnoff. See column 3, lines 37-50. Furthermore, FIG. 4 of U.S. Pat. No. 4,590,395 discloses a Zener diode coupling the gate and base electrodes of a hybrid Darlington amplifier together to promote high speed turnoff. See column 4, lines 19-38.

U.S. Pat. No. 4,604,535 discloses a two-stage amplifier using a junction field effect transistor to short-circuit the base to the emitter in an output stage bipolar transistor to eliminate the storage of charge in the base-to-emitter junction to promote high speed turnoff. See column 5, lines 21-28.

U.S. Pat. No. 4,028,561 discloses that the turn-off speed of a Darlington amplifier comprised of bipolar transistors may be enhanced by a third transistor. Carriers stored in the base and collector of the output bipolar transistor are discharged through the base emitter path of the third transistor which is coupled between the collector and emitter of the output bipolar transistor and the base and collector of the first input transistor. See column 3, lines 25-55.

U.S. Pat. No. 4,423,341 discloses that the turn-off speed of a field effect transistor is dependent upon the rate at which the gate capacitance can be discharged. See column 6, lines 9-32.

U.S. Pat. No. 4,492,883 discloses that the turn-off speed of a field effect transistor may be enhanced by the use of a junction field effect transistor to drain off residual charge stored in the gate-to-source capacitance of the field effect transistor. See column 1, lines 10-47.

U.S. Pat. No. 4,481,434 discloses that the turn-off speed of a field effect transistor may be enhanced by shorting the gate and source together by a bipolar transistor operated as a regenerative switch. See column 1, lines 32-38 and column 2, lines 21-38.

U.S. Pat. No. 4,500,801 discloses that the turn-off speed of a field effect transistor may be enhanced by a non-regenerative bipolar transistor which shorts the gate and source together. See column 1, lines 32-36.

DISCLOSURE OF INVENTION

The present invention is a Darlington-type amplifier having a first input field effect transistor and a second output bipolar transistor providing high speed turnoff. High speed turnoff is achieved by sequentially short-circuiting the gate to the source or drain of the input field effect transistor to discharge charge stored in the gate-to-source or drain capacitance and after turnoff of the field effect transistor and prior to the bipolar transistor being turned off removing minority carriers in the base region of the bipolar transistor by coupling the base of the bipolar transistor to a reference potential. This configuration produces an extremely fast turn-off time while achieving the control of high current amplitudes flowing between output terminals.

A circuit which is conductive to permit current flow between first and second terminals in response to application of a first level of a switching signal to an input and which is not conductive to block current flow between the first and second terminals in response to application of a second level of a switching signal to the input in accordance with the invention includes an output bipolar transistor having a collector connected to the first terminal, an emitter connected to the second terminal, and a base; an input field effect transistor having one of a source and drain connected to the first terminal and another of the source and drain connected to the base of the bipolar transistor and a gate coupled to the input, the field effect transistor turning on in response to the first level of the switching signal at the input and turning off in response to a second level of the switching signal at the input and the bipolar transistor turning on in response to turning-on of the field effect transistor to conduct current between the first and second terminals and turning off in response to turning-off of the field effect transistor to block current flow between the first and second terminals; a first switch having first and second terminals with the first terminal of the first switch being connected to the gate of the field effect transistor and the second terminal of the first switch being connected to one of the source and drain of the field effect transistor, the first and second terminals of the first switch being short-circuited together in response to the second level of the switching signal being applied to the input and being open-circuited from each other upon application of the first level of the switching signal to the input, the input being coupled to the control terminal of the first switch; a first switching circuit coupled between the base of the bipolar transistor and a first reference potential having first and second terminals which are short-circuited together upon application of a first level of a control signal to a control terminal of the first switching circuit to cause transfer of minority carriers from the base to the first reference potential and which are open-circuited upon application of a second level of the control signal; and a control signal generator, responsive to the switching signal changing to the second level, for generating a first level of the control signal after the field effect transistor has turned off prior to the turning-off of the bipolar transistor and for generating a second level of the control signal in response to the switching signal changing to the first level. The control signal generator includes a second switch having a control terminal and first and second terminals, one of the first and second terminals being coupled to a second reference potential, the first and second terminals of the second switch being short-circuited together in response to the second level of the switching signal and being open-circuited from each other upon application of the first level of the switching signal; a capacitor having a first terminal coupled to the first reference potential and a second terminal coupled to another of the first and second terminals of the second switch and to the control terminal of the first switching circuit, the capacitor generating the second control signal. Furthermore, a resistance is coupled to the capacitor for controlling a rate of charging of the capacitor from current flowing between the first and second reference potentials through the second switch and the resistance to cause the first level of the control signal to be produced a predetermined time interval after the switching signal changes to the second level.

Furthermore in accordance with the invention, a third switch is provided having a control terminal responsive to the switching signal and first and second terminals which are short-circuited together upon the application of the first level of the switching signal and which are open-circuited upon application of the second level of the switching signal, one of the first and second terminals of the third switch being coupled to the first terminal of the capacitor and another of the first and second terminals of the third switch being coupled to the second terminal of the capacitor, short-circuiting of the first and second terminals of the third switch causing discharge of any charge stored on the capacitor.

Furthermore, a diode is connected in series between the base of the bipolar transistor and the first switching circuit. A resistance is coupled in series with the diode to control the rate of flow of minority carriers from the base through the first switching circuit to the first reference potential.

In accordance with an embodiment of the invention, the bipolar transistor is an npn type; the field effect transistor is an enhancement type; the first switch is a bipolar transistor; and the first switching circuit is an enhancement-type field effect transistor. Furthermore, second and third switches are provided each having first and second terminals and a control terminal which is responsive to the switching signal, the first terminal of the second switch being coupled to the second reference potential, the first terminal of the third switch being coupled to the first reference potential, the second terminals being coupled together; and a field effect transistor is provided having one of a source and drain coupled to the second reference potential, a gate coupled to the second terminals of the second and third switches and another of the source and drain coupled to the gate of the input field effect transistor. Further in accordance with the invention, a bipolar transistor is provided having a base to which is applied the switching signal, a collector coupled to the second reference potential and an emitter coupled to the first reference potential, the collector of the bipolar transistor being coupled to the control terminal of the first switch.

A series circuit is coupled between the base and emitter of the output bipolar transistor which is coupled to the first and second terminals, the series circuit having a diode and a Zener diode with anodes of the diodes being connected together and a cathode of the diode connected to the base of the bipolar transistor and a cathode of the Zener diode connected to the emitter of the bipolar transistor.

In a circuit comprising an output bipolar transistor with a collector connected to a first terminal and an emitter connected to a second terminal and a base, an input field effect transistor in which one of a source and drain are connected to the first terminal and another of the source and drain are connected to the base and a switch having control, first and second terminals with the first terminal of the switch being connected to a gate of the field effect transistor and the second terminal of the switch being connected to the base, the first and second terminals of the switch being short circuited together in response to a control signal being applied to the control terminal and the circuit is switched into a conductive state permitting current flow between the first and second terminals in response to a first level of a switching signal and into a non-conductive state blocking current flow between the first and second terminals in response to a second level of the switching signal, a method of switching the circuit from the conductive state to the non-conductive state in accordance with the invention includes short-circuiting the gate to one of the source and drain of the field effect transistor by applying the control signal to the control terminal synchronous with the switching signal changing from the first level to a second level; and in response to the switching signal changing to the second level prior to the bipolar transistor being turned off and after the field effect transistor is turned off coupling the base of the bipolar transistor to a reference potential to cause the bipolar transistor to be turned off by transfer of minority carriers from the base to the reference potential. The control signal is generated in response to the switching signal.

BEST MODE FOR CARRYING OUT THE INVENTION

Figure 1:
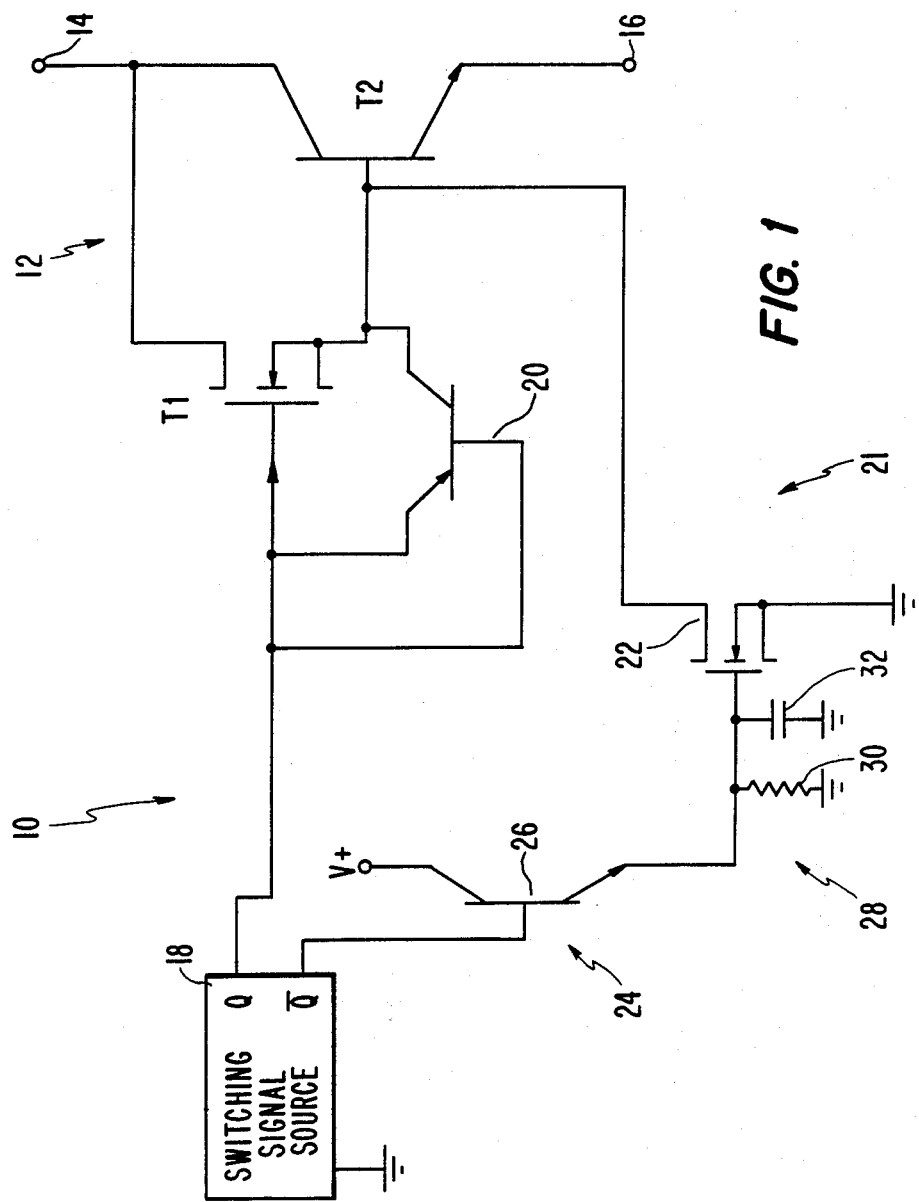
FIG. 1 is a block diagram of the present invention.

FIG. 1 illustrates a block diagram of a Darlington-type amplifier circuit 10 in accordance with the present invention having a high speed turnoff capability. The Darlington amplifier 12 is a hybrid type having a first input field effect transistor $T_1$ and an output bipolar transistor $T_2$ which controls the flow of current between a first terminal 14 and a second terminal 16 which may be respectively connected to a low impedance load (not illustrated) through which current flows between first and second reference potentials (not illustrated). The combination of the field effect transistor $T_1$ and the bipolar transistor $T_2$ functions as a Darlington amplifier which has a high input impedance and a low output impedance useful for controlling high current flow between terminals 14 and 16. Without additional circuitry, the Darlington amplifier has a relatively slow turnoff speed.

The present invention is directed to enhancing the speed of turning off the input field effect transistor $T_1$ and the output bipolar transistor $T_2$ in response to a control signal applied to the gate of the input field effect transistor $T_1$. Prior to discussion of the circuitry for enhancing the turnoff speed, it should be understood that the levels of the signals for controlling the turning on and off of the various circuit elements in FIG. 1 may be changed and the type of field effect transistors and bipolar transistors may be changed from the illustrated elements without departing from the invention. A switching signal source 18 provides a switching signal Q which represents any switching signal which is to be used for controlling the conduction of the Darlington amplifier 12. In the embodiment of FIG. 1, the transistors $T_1$ and $T_2$ turn on in response to a high level of the switching signal Q and turn off in response to a low level of the switching signal. A first switch 20 short-circuits the gate-to-source capacitance of the transistor $T_1$ when conductive to enhance its speed of turnoff. As illustrated, the switch 20 is a pnp bipolar transistor but the invention is not limited thereto. The bipolar transistor 20 turns on in response to the low level of the switching signal Q and turns off in response to the high level of the switching signal and has a conductivity opposite to field effect transistor $T_1$ so that when $T_1$ is on bipolar transistor 20 is off and when $T_1$ is off the bipolar transistor is on. The function of the switch is to discharge the gate-to-source capacitance at the time that the switching signal Q goes from a first level to a second level causing the field effect transistor $T_1$ to rapidly turn off. The opposite conductivity of transistor $T_1$ and bipolar transistor 20 ensures that the gate-to-source or drain capacitance is immediately short-circuited upon the switching signal changing to a level which turns off transistor $T_1$. Turn-off speed of the field effect transistor $T_1$ is enhanced by short-circuiting the gate-to-source capacitance. As illustrated, the transition of the switching signal from the high level to the low level initiates turning off the transistor $T_1$ at the same time that the pnp bipolar transistor 20 is turned on thereby immediately discharging the gate-to-source capacitance of transistor $T_1$ which causes the transistor $T_1$ to quickly turn off.

A first switching circuit 21 couples the base of transistor $T_2$ to a first reference potential to conduct minority carriers from the base of transistor $T_2$ to enhance its turnoff. The first switching circuit 21 has a field effect transistor 22 having a conductivity which is controlled by a control signal applied to the gate thereof. When the field effect transistor 22 is turned on, minority carriers from the base region are transferred from the base of the transistor $T_2$ to the first reference potential through the conductive field effect transistor 22 to enhance turnoff speed of transistor $T_2$. The switch 22 is turned on by a first level of the control signal and turned off by a second level of the control signal. The control signal is generated by a control signal generating circuit 24 which is comprised of a second switch 26 and an RC circuit 28 including resistance 30 and capacitor 32. The second switch 26, which may implemented as an npn bipolar transistor, is turned on by the switching signal $\overline{Q}$ going low which causes the inverted output $\overline{Q}$ to go high. When switch 26 becomes conductive, current flows from the second reference potential V+ through the switching circuit 26 to the RC circuit 28 causing the storage of charge on the capacitor 32. The RC circuit 28 functions to produce the control signal with the first (high) level of the control signal being generated when the charge on the capacitor is sufficient to forward-bias the field effect transistor 22, which occurs a predetermined time interval after the switching signal changes to the second level, and to produce the second low level of the control signal being when the second switch 26 is turned off.

It is important to note that the transistor 22 is turned on a predetermined time interval after the switching signal Q changes from the first level to the second level with the predetermined time interval having a length sufficient for the field effect transistor $T_1$ to be turned off with minority carriers from the collector being swept out by the load current through the emitter in response to the second level of the switching signal prior to transistor 22 being turned on. By timing the generation of the first level of the second control signal to occur after the first field effect transistor. $T_1$ has turned off permits any minority carriers in the base region of the transistor $T_2$ to be rapidly transferred to ground to cause a rapid turnoff of the transistor $T_2$. The above-described sequence of controlling the turning-on of the switches 20 and 22 is what achieves the high speed turnoff capability of the present invention.

Figure 2:
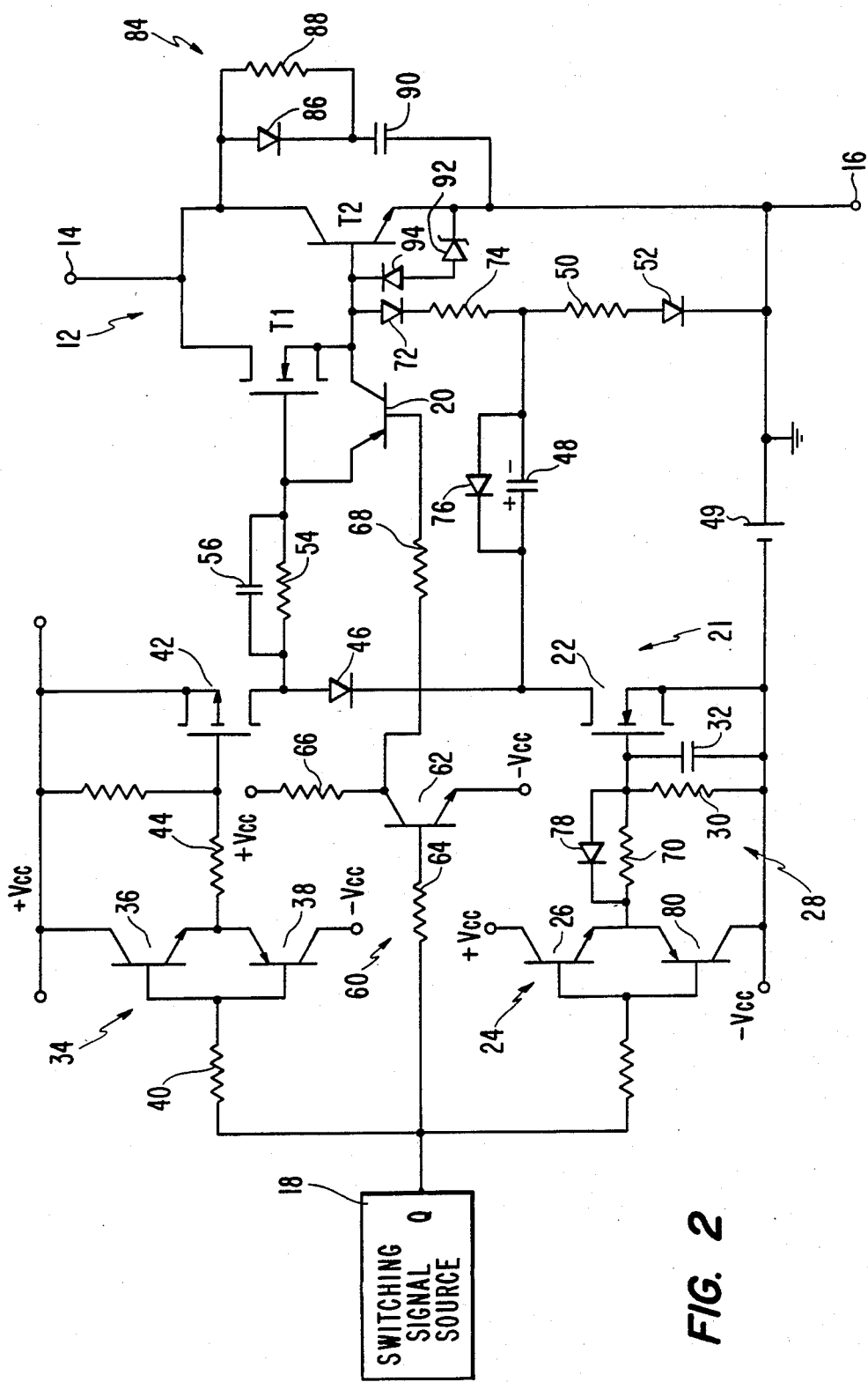
FIG. 2 is a circuit schematic of an embodiment of the present invention.

FIG. 2 illustrates an electrical schematic of a preferred embodiment of the present invention. Like parts in FIGS. 1 and 2 are identified by like reference numerals. It should be understood that FIGS. 1 and 2 differ in that the first level of the switching signal for turning on the transistors $T_1$ and $T_2$ in FIG. 1 is high while in FIG. 2 the first level of the switching signal for turning on the transistors $T_1$ and $T_2$ is low. Similarly, in FIG. 1 the second level of the switching signal for turning off transistors $T_1$ and $T_2$ is low while in FIG. 2 the second level of the switching signal is high. The switching signal source 18 of FIG. 2 differs from the corresponding switching signal source 18 of FIG. 1 in that only the switching signal Q is outputted instead of the switching signal and in inverted form $\overline{Q}$ thereof.

Turning-on of the Darlington amplifier 12 is controlled by a turn-on circuit 34. The turn-on circuit 34 includes a pair of emitter follower bipolar transistors 36 and 38 of opposite conductivity type which are coupled in series between a second reference potential $V_{cc}$ and a first reference potential $-V_{cc}$. The gates of the bipolar transistors 36 and 38 are coupled together and connected to the output Q of the switching signal source 18 by resistance 40. Upon application of a high level of the switching signal, the transistor 36 turns on and the second transistor 38 turns off and upon application of a low level of the switching signal Q the first transistor 36 turns off and the second transistor 38 turns on. The output signal from the common emitters of the transistors 36 and 38 is applied to the gate of an enhancement-type field effect transistor 42 by means of resistance 44. The drain of field effect transistor 42 is coupled to ground potential by a series circuit 45 comprising diode 46, capacitor 48, resistor 50 and diode 52 which permits current flow from the second reference potential $V_{cc}$ through transistor 42, diode 46, capacitor 48, resistance 50 and diode 52 to ground potential when the field effect transistor 42 is turned on. The aforementioned current flow charges capacitor 48 to a potential as indicated substantially equal to the second reference potential $V_{cc}$. The sum of the potential stored on capacitor and the potential of power source 49 is applied to the base of transistor T2 when transistor 22 is turned on to apply a high reverse base drive to transistor T2 to speed up turn off. Additionally, when the field effect transistor 42 is turned on the source applies a signal to the gate of the field effect transistor $T_1$ through the parallel combination of resistance 54 and capacitance 56. The parallel combination of resistor 54 and capacitor 56 speeds up turn-on of the field effect transistor $T_1$ by causing the full change in potential to the high level caused by turning on field effect transistor 42 to be applied to the gate of $T_1$. The resistance 54 limits the gate drive of field effect transistor $T_1$ during steady state. When the switching signal Q has a first (low) level, transistor 38 turns on causing transistor 42 to turn on which raises the potential at the gate of transistor $T_1$ causing it to turn on which in turn causes transistor $T_2$ to turn on to permit current flow between terminals 14 and 16. When the output signal Q from the switching signal source 18 switches to the second level, (high) the transistor 36 turns on which causes transistor 42 to turn off to drive the gate of field effect transistor $T_1$ low to cause it to turn off.

The circuit 60 for discharging the gate-to-source capacitance of the field transistor $T_1$ generates a control signal for turning on the bipolar transistor 20 to short-circuit the gate-to-source capacitance of the field effect transistor $T_1$ when it is desired to turn it off. The gate discharging circuit 60 includes a bipolar transistor 62 having a base coupled to the switching signal source 18 through resistance 64. The collector of the bipolar transistor 62 is coupled to the second reference potential $V_{cc}$ by resistor 66. The emitter of the bipolar transistor 62 is coupled to the first reference potential $-V_{cc}$. The resistance 64 limits the amount of current drawn by the bipolar transistor 62. The bipolar transistor 62 inverts the switching signal which is applied to the base of bipolar transistor 20 by resistance 68. When the output signal Q of the switching signal source 18 is high transistor 62 turns on which causes transistor 20 to turn on to short the gate-to-source capacitance of the field effect transistor $T_1$. When the transistor 62 is turned off, the transistor 20 turns off at which time the field effect transistor $T_1$ is conductive.

The control signal for turning on the first switching circuit 21 is produced by the parallel combination of resistor 30 and capacitor 32 which is charged by current flowing from the second reference potential through bipolar transistor 26 through resistance 70 to charge up the capacitor 32 in accordance with the RC time constant determined by the combination of resistors 30, 70 and the capacitor 32. The potential at the gate of the field effect transistor 22 reaches a level sufficient to turn on the field effect transistor, which is the first level of the control signal, to cause minority carriers in the base region of the bipolar transistor $T_2$ to flow through diode 72, resistor 74, diode 76 and the field effect transistor 22 to the first reference potential. Providing this path for transferring the minority carriers from the base of the bipolar transistor $T_2$ speeds up its turnoff. A diode 78 is connected in parallel with the resistance 70 to provide a low impedance path for discharging the charge on capacitor 32 when bipolar transistor 80 is switched into conduction upon the switching signal going to the first level. A snubber 84 is coupled in parallel with the collector and emitter of the bipolar transistor $T_2$ to provide protection against induced high voltage potentials in a conventional manner produced by switching of inductive loads. During normal conduction capacitor 90 prevents steady-state current flow through the snubber circuit 84. The charge on the capacitor 90 is discharged during turning-off of the bipolar transistor $T_2$. Zener diode 92 and diode 94 provide a shunt for protecting the base-to-emitter junction of the bipolar transistor $T_2$ from high potentials.

Set forth below in Table I is a summary of the switching signal states of the various transistors illustrated in FIG. 2.

While the invention has been described in terms of its preferred embodiment, it should be understood that numerous modifications may be made thereto without departing from the spirit and scope of the invention. It is intended that all such modifications fall within the scope of the appended claims.

We claim:

1. A circuit which is conductive to permit current flow between first and second terminals in response to application of a first level of a switching signal to an input and which is not conductive to block current flow between the first and second terminals in response to application of a second level of the switching signal to the input comprising:
   (a) an output bipolar transistor having a collector connected to the first terminal, an emitter connected to the second terminal, and a base;
   (b) an input field effect transistor having one of a source and drain connected to the first terminal and another of the source and drain connected to the base of the bipolar transistor and a gate coupled to the input, the field effect transistor turning on in response to the first level of the switching signal at the input and turning off in response to a second level of the switching signal at the input and the bipolar transistor turning on in response to turning on of the field effect transistor to conduct current between the first and second terminals and turning off in response to turning off of the field effect transistor to block current flow between the first and second terminals;
   (c) a first switch having first and second terminals with the first terminal of the first switch being connected to the gate of the field effect transistor and the second terminal of the first switch being connected to one of the source and drain of the field effect transistor, the first and second terminals of the first switch being short-circuited together in response to the second level of the switching signal being applied to the input and being open-circuited from each other upon application of the first level of the switching signal to the input, the input being coupled to a control terminal of the first switch;
   (d) first switching means, coupled between the base of the bipolar transistor and a first reference potential, having first and second terminals which are short-circuited together upon application of a first level of a control signal to a control terminal of the first switching means to cause transfer of minority carriers from the base to the first reference potential and which are open-circuited upon application of a second level of the control signal; and
   (e) means, responsive to the switching signal, for generating a first level of the control signal after the field effect transistor has turned off prior to the turning-off of the bipolar transistor and for generating a second level of the control signal in response to the switching signal changing to the first level.

2. A circuit in accordance with claim 1 wherein the means for generating the control signal comprises:

TABLE I

| Switching Signal Level | 36 | 38 | 26 | 80 | 62 | 42 | 22 | 20 | T1 | T2 |
|---|---|---|---|---|---|---|---|---|---|---|
| Low | Off | On | Off | On | Off | On | Off | Off | On | On |
| High | On | Off | On | Off | On | Off | On | On | Off | Off |

(a) a second switch having a control terminal and first and second terminals, one of the first and second terminals being coupled to a second reference potential, the first and second terminals of the second switch being short-circuited together in response to the second level of the switching signal and being open-circuited from each other upon application of the first level of the switching signal; and (b) a capacitor having a first terminal coupled to the first reference potential and a second terminal coupled to another of the first and second terminals of the second switch and to the control terminal of the first switching means, the capacitor generating the second control signal.

3. A circuit in accordance with claim 2 further comprising:

a resistance coupled to the capacitor for controlling a rate of charging of the capacitor from current flowing between the first and second reference potentials through the second switch and the resistance.

4. A circuit in accordance with claim 3 further comprising:

(a) a third switch having a control terminal responsive to the switching signal and first and second terminals which are short-circuited together upon application of the first level of the switching signal and which are open-circuited upon application of the second level of the switching signal, one of the first and second terminals of the third switch being coupled to the first terminal of the capacitor and another of the first and second terminals of the third switch being coupled to the second terminal of the capacitor, short circuiting of the first and second terminals of the third switch causing discharge of any charge stored on the capacitor.

5. A circuit in accordance with claim 3 further comprising:

a diode connected in series between the base of the bipolar transistor and the first switching means.

6. A circuit in accordance with claim 4 further comprising:

a resistance coupled in series with the diode.

7. A circuit in accordance with claim 1 wherein:

(a) the output bipolar transistor is an npn type;
(b) the input field effect transistor is an enhancement type;
(c) the first switch is a bipolar transistor; and
(d) the first switching means is an enhancement-type field effect transistor.

8. A circuit in accordance with claim 1 further comprising:

(a) second and third switches each having first and second terminals and a control terminal which is responsive to the switching signal, the first terminal of the second switch being coupled to a second reference potential, the first terminal of the third switch being coupled to a first reference potential, the second terminals being coupled together; and (b) a control field effect transistor having one of a source and drain coupled to the second reference potential, a gate coupled to the second terminal of the second and third switches and another of the source and drain coupled to the input field effect transistor.

9. A circuit in accordance with claim 8 further comprising:

a capacitor having a first terminal coupled to another of the source and drain of the control field effect transistor and a second terminal coupled to the first reference potential, the capacitor being changed during conduction of the control field effect transistor to apply a bias to the first switching means for turning on the switching means in response to the first level of the control signal.

10. A circuit in accordance with claim 8 further comprising:

a control bipolar transistor having a base to which is applied the switching signal, a collector coupled to the second reference potential and an emitter coupled to the first reference potential, the collector of the control bipolar transistor being coupled to the control terminal of the first switch.

11. A circuit in accordance with claim 1 further comprising:

a series circuit coupled between the base and emitter of the output bipolar transistor, the series circuit having a diode and a Zener diode with anodes of the diodes being connected together and a cathode of the diode coupled to the base of the bipolar transistor and a cathode of the Zener diode coupled to the emitter of the bipolar transistor.

12. In a circuit comprising an output bipolar transistor with a collector connected to a first terminal and an emitter connected to a second terminal and a base, an input field effect transistor in which one of a source and drain is connected to the first terminal and another by the source and drain is connected to the base and a switch having control, first and second terminals with the first terminal of the switch being connected to a gate of the field effect transistor and the second terminal of the switch being connected to the base, the first and second terminals of the switch being short circuited together in response to a control signal being applied to the control terminal and the circuit is switched into a conductive state permitting current flow between the first and second terminals in response to a first level of a switching signal and into a nonconductive state blocking current flow between the first and second terminals in response to a second level of the switching signal, a method of switching the circuit from the conductive state to the nonconductive state comprising:

(a) short circuiting the gate to one of a source and drain of the field effect transistor by applying the control signal to the control terminal synchronous with the switching signal changing from the first level to a second level; and (b) in response to the switching signal changing to the second level prior to the bipolar transistor being turned off after the field effect transistor is turned off coupling the base of the bipolar transistor to a reference potential to cause the bipolar transistor to be turned off by transfer of minority carriers from the base to the reference potential.

13. A method in accordance with claim 12 wherein:

the control signal is generated in response to the switching signal.

14. A circuit which is conductive to permit current flow between first and second terminals in response to application of a first level of a switching signal to an input and which is not conductive to block current flow between the first and second terminals in response to application of a second level of the switching signal to the input comprising:

(a) a bipolar transistor having a collector connected to the first terminal, an emitter connected to the second terminal, and a base;
(b) a field effect transistor having one of a source and drain connected to the first terminal and another of the source and drain connected to the base of the bipolar transistor and a gate coupled to the input, the field effect transistor turning on in response to the first level of the switching signal at the input and turning off in response to a second level of the switching signal at the input and the bipolar transistor turning on in response to turning on of the field effect transistor to conduct current between the first and second terminals and turning off in response to turning off of the field effect transistor to block current flow between the first and second terminals;
(c) a first switch having first and second terminals with the first terminal of the first switch being connected to the gate of the field effect transistor and the second terminal of the first switch being connected to the another of the source and drain of the field effect transistor, the first and second terminals of the first switch being short circuited together in response to the second level of the switching signal being applied to the input and being open circuited from each other upon application of the first level of the switching signal to the input, the input being coupled to a control terminal of the first switch;
(d) first switching means, coupled between the base of the bipolar transistor and a first reference potential, having first and second terminals which are short circuited together upon application of a first level of a control signal to a control terminal of the first switching means and which are open circuited upon application of a second level of the control signal; and
(e) control means, for generating the switching signal and for generating a first level of the control signal prior to turn off of the output bipolar transistor a predetermined time interval after the switching signal changes from the first level to the second level with the predetermined interval having a length sufficient for the field effect transistor to be turned off in response to the second level of the switching signal and for generating a second level of the control signal in response to the switching signal changing to the first level.

* * * * *